United States Patent
Han et al.

(10) Patent No.: US 7,220,065 B2
(45) Date of Patent: May 22, 2007

(54) CONNECTION APPARATUS FOR PARALLEL OPTICAL INTERCONNECT MODULE AND PARALLEL OPTICAL INTERCONNECT MODULE USING THE SAME

(75) Inventors: Sang Pil Han, Daejeon-Shi (KR); In Kui Cho, Daejeon-Shi (KR); Chul Sik Kee, Daejeon-Shi (KR); Seung Ho Ahn, Daejeon-Shi (KR); Hee Kyung Sung, Daejeon-Shi (KR)

(73) Assignee: Electronics and Telecommunications Research Institute, Daejon-shi (KR)

( * ) Notice: Subject to any disclaimer, the term of this patent is extended or adjusted under 35 U.S.C. 154(b) by 133 days.

(21) Appl. No.: 10/923,853

(22) Filed: Aug. 24, 2004

(65) Prior Publication Data
US 2005/0141823 A1 Jun. 30, 2005

(30) Foreign Application Priority Data
Dec. 24, 2003 (KR) .................... 10-2003-0096043

(51) Int. Cl.
*G02B 6/36* (2006.01)
(52) U.S. Cl. .................... 385/89; 385/53; 385/88
(58) Field of Classification Search ................. 385/53, 385/88, 89
See application file for complete search history.

(56) References Cited

U.S. PATENT DOCUMENTS

| 5,574,814 A | 11/1996 | Noddings et al. |
| 5,631,988 A | 5/1997 | Swirhun et al. |
| 5,901,262 A * | 5/1999 | Kobayashi et al. ........... 385/89 |
| 6,580,846 B1 * | 6/2003 | Burroughs et al. ........... 385/16 |
| 6,912,332 B2 * | 6/2005 | Han et al. ..................... 385/14 |

FOREIGN PATENT DOCUMENTS

| KR | 000025095 | 5/2000 |
| KR | 10/2001/0024407 | 3/2001 |
| KR | 2003-0013075 | 2/2003 |

OTHER PUBLICATIONS

Usui et al.; "ParaBIT-1: 60-Gb/s-Throughput Parallel Optical Interconnect Module"; IEEE; 2000; pp. 1252-1258.
Hikita et al.; "Polymeric Optical Waveguide Films for Short-Distance Optical Interconnects"; IEEE; 1999; pp. 1237-1242.
Kosaka; "Smart Integration and Packaging of 2-D VCSEL's for High-Speed Parallel Links"; IEEE; 1999; pp. 184-192.
Karstensen et al.; "Module Packaging for High-Speed Serial and Parallel Transmission"; IEEE; 2000; pp. 479-486.

* cited by examiner

*Primary Examiner*—Jennifer Doan
(74) *Attorney, Agent, or Firm*—Lowe Hauptman & Berner LLP

(57) ABSTRACT

Provided is an optical connection apparatus for a parallel optical interconnect module and a parallel optical interconnect module using the same for reducing a coupling loss generated due to an alignment error when coupled with an optical fiber, comprising: a 2D reflector in a prism shape and having at least two rows of cylinder type lens attached thereto; a 2D optical waveguide having at least two layers of core arrays; at least two rows of 2D optical benches; and a 2D ferrule capable of loading at least two layers of optical fibers so as to facilitate the fixing of the 2D optical waveguide for optical interconnection.

14 Claims, 9 Drawing Sheets

CONNECTION APPARATUS FOR PARALLEL OPTICAL INTERCONNECT MODULE AND PARALLEL OPTICAL INTERCONNECT MODULE USING THE SAME

BACKGROUND

1. Field of the Invention

The present invention generally relates to a connection apparatus for a parallel optical interconnect module and a parallel optical interconnect module that an optical signal is transmitted or received through an optical fiber, and more particularly, to a connection apparatus for a parallel optical interconnect module and a parallel optical interconnect module, comprising a 2D reflector with a prism reflecting surface having at least two rows of cylinder type lenses so as to reduce a coupling loss generated from a misalignment when coupled with optical fiber, a 2D optical waveguide having at least two layers of core array, at least two rows of 2D silicon optical benches to reduce a coupling loss generated from a misalignment when coupled with optical fiber, a 2D ferrule for loading at least two layers of optical fibers to facilitate the fixing of the 2D optical waveguide for optical coupling.

2. Discussion of Related Art

Generally known in the art, in low-speed telecommunication system and so on, a connection between circuit boards, chips or systems is conducted through an electric metal cable. However, with the high-capacity and the increase of transfer rate of information such as in an advanced telecommunication system constituted with a high-capacity parallel computer or a 1 or more Tb/s class asynchronous transfer mode (ATM) switching system and so on, if used such metal cable, there is caused an electrical problem such as skewing or electromagnetic interference (EMI) and so on, thereby reducing operational efficiency of the system and making the integration of system difficult.

Recently, a technology of optical connection using an optical transceiving module has thus been developed wherein as a method for optical connection in the optical transceiving module, a direct coupling type of an optical receiving device to a ribbon optical fiber multi-channel optical connector with 45° tilt-angled reflector, a coupling type of a polymer optical waveguide having 45° tilt-angled reflector and to which an optical transceiving device is coupled, to a multi-channel optical connector, a coupling type of a polymer optical waveguide to which an optical transceiving device is vertically coupled, to a multi-channel optical connector, a vertical coupling type of an optical transceiving device fixed to a plastic package to a multi-channel optical connector and so on are used. Herein, as an optical transmission device, i.e., a light source, Vertical Cavity Surface Emitting Laser (VCSEL) Array is employed, and as an optical receiving device, i.e., a photodetector, a Photo Diode (PD) Array is employed.

Korean Patent Application No. 2000-7003642 (filing date: 2000 Apr. 4) entitled "Optical Module" is constructed such that light oscillated through a light exit is reflected at a 90° angle by an optical waveguide and is then transmitted to an optical fiber connected with an optical connector along a core formed to a substrate.

"ParaBIT-1: 60-Gb/s-Throughput Parallel Optical Interconnect Module" announced at ECTC 2000 on May, 2000 by N. Usui is constructed such that a 24-channel polymer waveguide film with a planar reflector tilted at a 45 degrees angle and a 24-optical fiber BF connector are connected with each other wherein the optical waveguide film and the connector are manually assembled.

Among the technologies introduced above, it is evaluated that the coupling type of the polymer optical waveguide having 45° tilt-angled reflector and to which the optical transceiving device is coupled, to the multi-channel optical connector is a most effective method in that the reflector being relatively easily formed, and an optical coupler, an optical switch, Wavelength Division Multiflexing (WDM) device, and so on are built in the polymer optical waveguide to achieve functional extension of the whole module.

However, when used such technology for optical coupling in order to manufacture an optical transceiving module for parallel optical interconnect having a subsequent extended function, although a misalignment is generated a little bit upon coupling the optical transceiving device with the optical fiber, a large coupling loss is caused so that satisfactory efficiency cannot be achieved. It is thus true that a structural improvement of the optical transceiving module for parallel optical interconnect is required in order to minimize the coupling loss.

SUMMARY OF THE INVENTION

The present invention is directed to an optical connection apparatus for a parallel optical interconnect module and a parallel optical interconnect module using the same. According to an exemplary embodiment of the present invention, the parallel optical interconnect module is provided in which light source/photodetector is fixedly buried in a trench in a manual alignment method by use of a 2D silicon optical bench and a 2D ferrule to which a 2D optical waveguide is attached is fixed to an adapter so that an alignment error between the 2D optical waveguide and the light source/photodetector is minimized, whereby in the course of transmitting an optical signal, a coupling loss is minimized to increase optical power, and the optical coupling by the manual alignment is facilitated to increase productivity so that the optical interconnection is achieved with a reduced cost.

The present invention is also directed to an a parallel optical interconnect module in which a 2D reflector is formed or attached to an end of a core forming at least two layers of 2D waveguide so as to conduct an exact path change at 90 degrees angle and a focusing of light, a light source/photodetector is fixedly buried in a trench in a manual alignment method by use of a 2D silicon optical bench, and a 2D ferrule to which a 2D optical waveguide is attached is fixed to an adapter, so that an alignment error between the 2D optical waveguide and the light source/photodetector is minimized, whereby in the course of transmitting an optical signal, a coupling loss is minimized to increase optical power, and the optical coupling by a manual alignment is facilitated to increase productivity so that an optical interconnection is achieved with a reduced cost.

The present invention is also directed to a method for manufacturing a parallel optical interconnect module by which improvement of productivity is obtained due to the packaging of two rows of light source/photodetector array chip in a manual alignment manner and increased efficiency of optical coupling between two rows of light source/photodetector and 2D optical waveguide is achieved.

One aspect of the present invention is to provide A parallel optical interconnect module comprising: a substrate on which an electrode pad and a given electric circuit pattern are formed; a printed circuit board having a heat spreader in a trench on the substrate; a 2D optical bench provided on the substrate and in which the trench is formed; a light source provided in the trench to be constituted in at least two rows, so as to generate an optical signal and output the optical signal to an exterior through an opening; a driver provided on the substrate to drive the light source according to an electric signal supplied through the electrode pad; a 2D reflector designed in a prism shape and having at least two rows of cylinder type lens attached thereto to change paths of at least two rows of optical signals emitted from the light source; a 2D optical waveguide having at least two layers of core arrays formed so as to direct light reflected from the 2D reflector; and a 2D ferrule capable of loading at least two layers of optical fibers supporting the 2D optical waveguide so as to transmit the light transferred from the 2D optical waveguide to an optical fiber.

Another aspect of the present invention is to provide a parallel optical interconnect module comprising: a substrate on which an electrode pad and a given electric circuit pattern are formed; a printed circuit board having a heat spreader formed by the formation of a trench formed on a part of the substrate; a 2D optical bench provided on the substrate and in which the trench is formed; a photodetector provided in the trench formed in the 2D optical bench to be constituted in at least two rows, so as to detect an optical signal transferred from an exterior through an opening; a receiver provided on the substrate so as to amplify an electric signal supplied from the photodetector and to output the electric signal through the electrode pad; a 2D reflector designed in a prism shape and having at least two rows of cylinder type lens attached thereto to change paths of at least two rows of optical signal incident from an exterior; a 2D optical waveguide having at least two layers of core arrays formed so as to direct light reflected from the 2D reflector; and a 2D ferrule capable of loading at least two layers of optical fibers supporting the 2D optical waveguide so as to transmit the light from an optical fiber to the 2D optical waveguide.

Yet another aspect of the present invention is to provide a parallel optical interconnect module comprising: a substrate on which an electrode pad and a given electric circuit pattern are formed; a printed circuit board having a heat spreader formed by the formation of a trench formed on a part of the substrate; a 2D optical bench provided on the substrate and in which the trench is formed; a photodetector and a light source provided in the trench formed in the 2D optical bench to be respectively constituted in at least one row, wherein the light source generates an optical signal and outputs the generated optical signal to an exterior through an opening and the photodetector detects the optical signal transferred from the exterior through the opening; a driver and a receiver provided on the substrate, wherein the driver drives the light source according to an electric signal supplied through the electrode pad and the receiver amplifies the electric signal supplied from the photodetector to output the amplified electric signal through the electrode pad; a 2D reflector designed in a prism shape and having at least two rows of cylinder type lens attached thereto to change a path of the optical signal outputted from the light source or inputted to the photodetector; a 2D optical waveguide having at least two layers of core arrays formed so as to direct the light reflected from the 2D reflector; and a 2D ferrule capable of loading at least two layers of optical fibers supporting the 2D optical waveguide so as to transmit the light from the 2D optical waveguide to an optical fiber.

Preferably, the light source is a surface emitting laser, the photodetector is a photo diode, and the 2D ferrule attached to the 2D optical waveguide is fixed by an adapter.

Yet another aspect of the present invention is to provide an optical connection apparatus for a parallel optical interconnect module, comprising: a 2D reflector designed in a prism shape and having at least two rows of cylinder type lens attached thereto to change paths of optical signals emitting in at least two rows; a 2D optical waveguide having at least two layers of core arrays formed so as to direct light reflected from the 2D reflector; and a 2D ferrule capable of loading at least two layers of optical fibers supporting the 2D optical waveguide so as to transmit the light from the 2D optical waveguide to an optical fiber.

According to the present invention, the present invention provides a parallel optical interconnect module with an improved structure which facilitates the coupling with an optical fiber to minimize an optical coupling loss so that high-capacity and highly-densified data being transferred fast.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

Figure 1A:
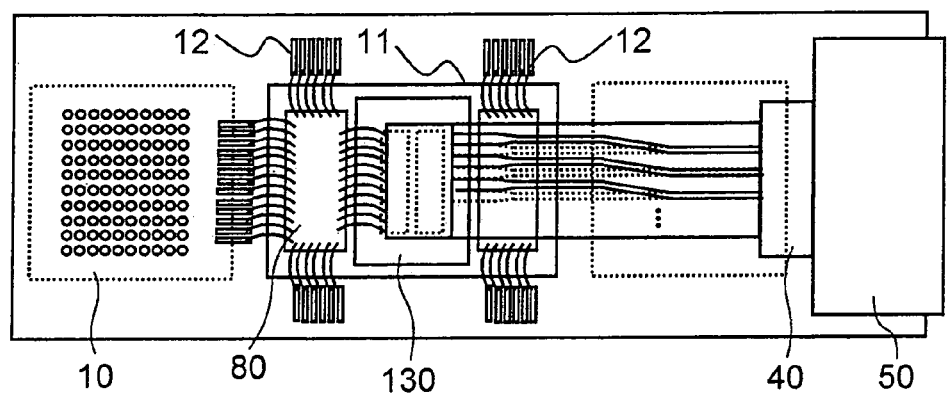
FIGS. 1A and 1B are a plan view and a side view, respectively, showing a 24-channel parallel optical interconnect transmission module (Tx—Tx module) according to an exemplary embodiment of the present invention.

The present invention will now be described more fully hereinafter with reference to the accompanying drawings, in which exemplary embodiments of the invention are shown.

This invention may, however, be embodied in different forms and should not be construed as limited to the embodiments set forth herein. Rather, these embodiments are provided so that this disclosure will be thorough and complete, and will fully convey the scope of the invention to those skilled in the art. For example, if one layer is described to be positioned on another layer, which means that one layer may be positioned directly on another layer, or otherwise, a third layer may be interposed between the two layers. Also, in the drawings, a thickness or a size of the respective layers is depicted exaggerated for convenience and clearness of explanation. Like numbers refer to like elements throughout the specification.

(Parallel Optical Interconnect Optical Transmission Module)

Figure 1B:
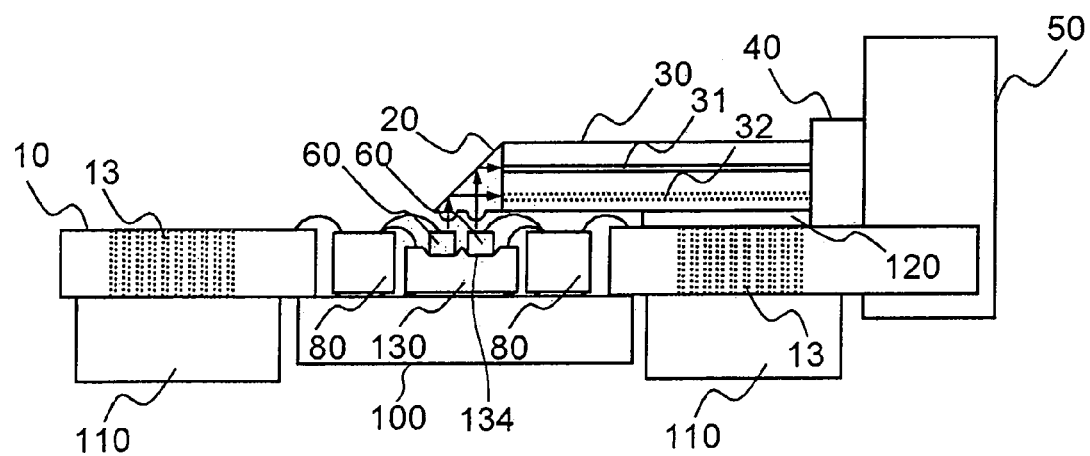

FIGS. 1A and 1B are a plan view and a side view, respectively, showing a 24-channel parallel optical interconnect transmission module (Tx—Tx module) according to an exemplary embodiment of the present invention.

Referring to FIGS. 1A and 1B, the 24-channel parallel optical interconnect transmission module (Tx—Tx module) according to an exemplary embodiment of the present invention includes a substrate 10 having a transmission trench 11, a transmission electrode pad 12, a via hole 13 and a given transmission electric circuit pattern (not shown), and a 2D silicon optical bench 130 having a trench 134 formed on a part thereof. The 24-channel parallel optical interconnect transmission module also includes a light source 60 in the trench 134, a driver 80 for driving the light source 60 according to an electric signal supplied through the electrode pad 12 on the substrate 10, an adapter 50 connected with an optical connector (not shown) connected to an optical fiber, a 2D optical waveguide 30 having the first and second layers of cores 32 and 31, and a 2D reflector 20 at one end portion of the cores, and a 2D ferrule 40 for fixing the 2D optical waveguide 30 to the adapter 50. Meanwhile, the substrate 10 and the adapter 50 are coupled to each other in such a manner that an opening (not shown) of the light source 60 is opposite to a reflecting surface of the 2D reflector 20. In the 2D silicon optical bench 130, the light source 60 is buried in the trench 134 that is formed in consideration of a size of the light source 60, so that a precise manual alignment is automatically achieved.

More specifically, two drivers 80 and two light sources 60 are respectively formed on the substrate 10, for example, on a heat spreader in an array form. The driver 80 is bonded on a printed circuit board (PCB) by use of solders (not indicated), and the light source 60 is bonded on a bottom surface of the trench 134 formed in the 2D silicon optical bench 130 by use of the solders.

The driver 80 is connected with the electrode pad 12 by use of a bonding wire (not shown), and the light source 60 is connected with the driver 80 by use of the bonding wire. Also, the light source 60 may employ vertical cavity surface emitting laser (VCSEL), and has an opening at its upper portion through which light, i.e., optical signal, emitted from the light source is discharged. The driver 80 serves to drive the light source 60 using an electric signal supplied through the electrode pad 12.

The thicknesses of the cores 31 and 32 of the 2D optical waveguide 30 are constant, but the widths thereof are different from each other so that the widths at a portion where the 2D reflector 20 is coupled are narrowed like a taper shape and the widths at a portion where the 2D ferrule 40 is coupled are the same as the thicknesses of the cores 31 and 32. The longitudinal structure of the cores 31 and 32 of the 2D optical waveguide 30 is provided such that at the portion where the 2D reflector 20 is coupled, the first and second layers of cores 32 and 31 are spaced apart from each other by about 125 µm, but the second layer of core 31 is formed, at its middle portion, as a bend structure so that the first and second layers of cores 32 and 31 are finally not spaced apart from each other at a portion where the 2D ferrule 40 is coupled.

On the substrate 10, the electrode pads 12 and 15 and a given circuit pattern (not shown) are formed. As the substrate 10, a PCB can be used, which is composed of a material having sufficient low impedance matching, crosstalk, or skew, such as for example, FR-4, Teflon and so on.

The via hole 13 in the substrate 10 is an electrical path for connecting an external electric signal with the driver 80 and the receiver 90, and a Magarray 110 attached to the bottom of the substrate 10 is an electric connector through which the external electric signal is connected in a ball grid array (BGA) method. The heat spreader 100 as a part of the substrate 10 serves to firstly discharge heat generated from the light source 60 and the driver 80.

An electrode of the 2D silicon optical bench is formed on the 2D silicon optical bench 130 so that it is connected with the electrode pad (not shown) of the light source 60 and with the neighboring PCB electrode 12 by wire bonding. The light source 60 is mounted in the trench 134 of the 2D silicon optical bench 130, which is attached on the heat spreader 100 by use of an adhesive (not shown) with high heat-conductivity. The 2D optical waveguide 30 is arranged and attached on a supporter 120 of the 2D optical waveguide.

(Parallel Optical Interconnect Receiving Module)

Figure 2A:
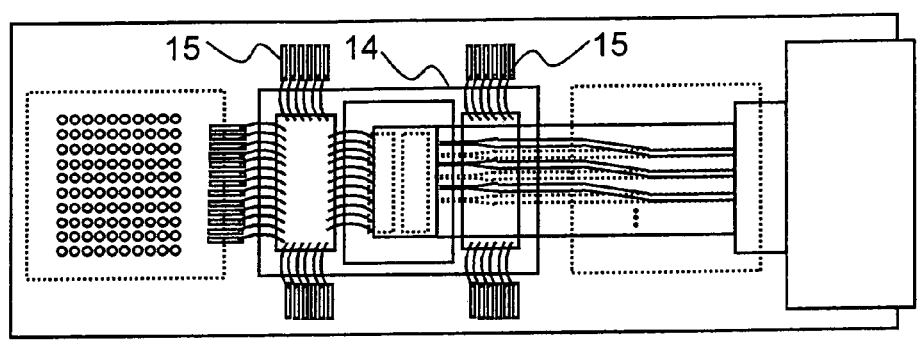
FIGS. 2A and 2B are a plan view and a side view, respectively, showing a 24-channel parallel optical interconnect receiving module (Rx—Rx module) according to an exemplary embodiment of the present invention.
Figure 2B:
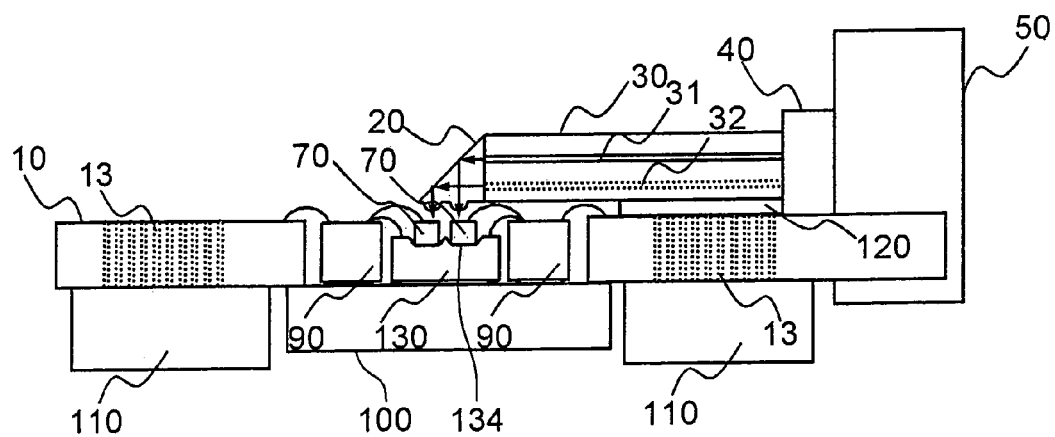
Figure 3A:
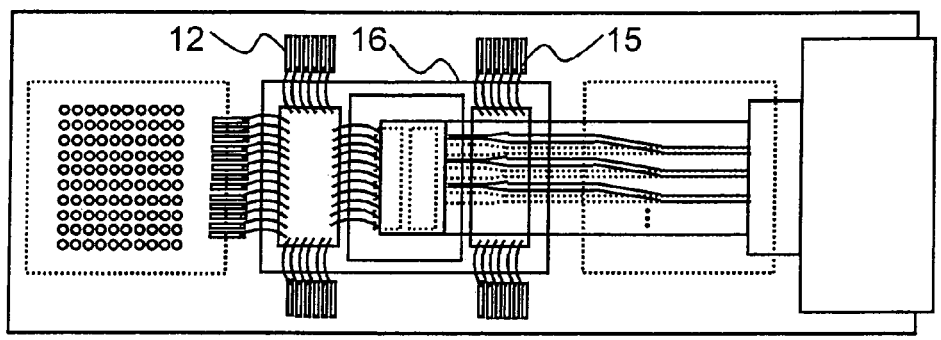
FIGS. 3A and 3B are a plan view and a side view, respectively, showing a 12-channel parallel optical interconnect transceiving module (Tx—Rx module) according to an exemplary embodiment of the present invention.
Figure 3B:
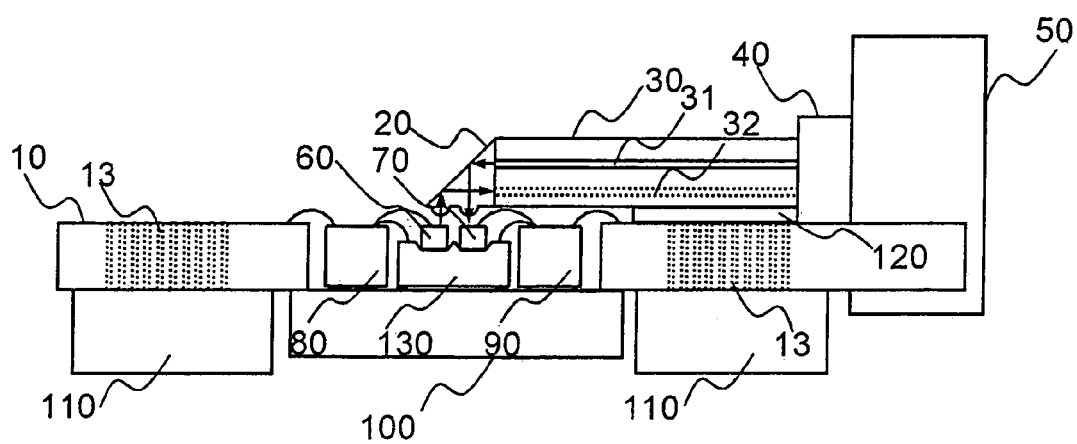
Figure 4A:
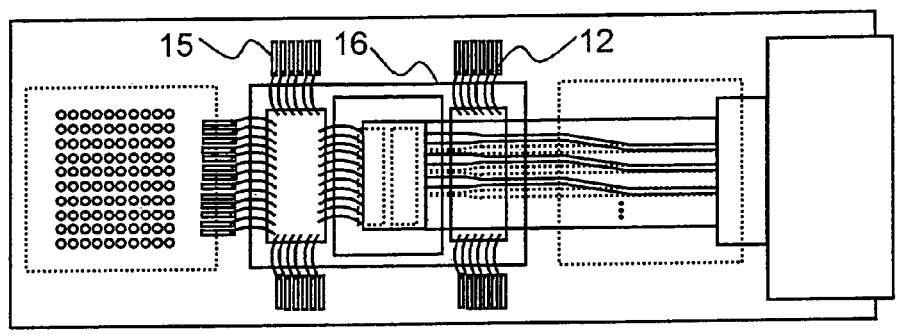
FIGS. 4A and 4B are a plan view and a side view, respectively, showing a 12-channel parallel optical interconnect transceiving module (Rx-Tx module) according to an exemplary embodiment of the present invention.
Figure 4B:
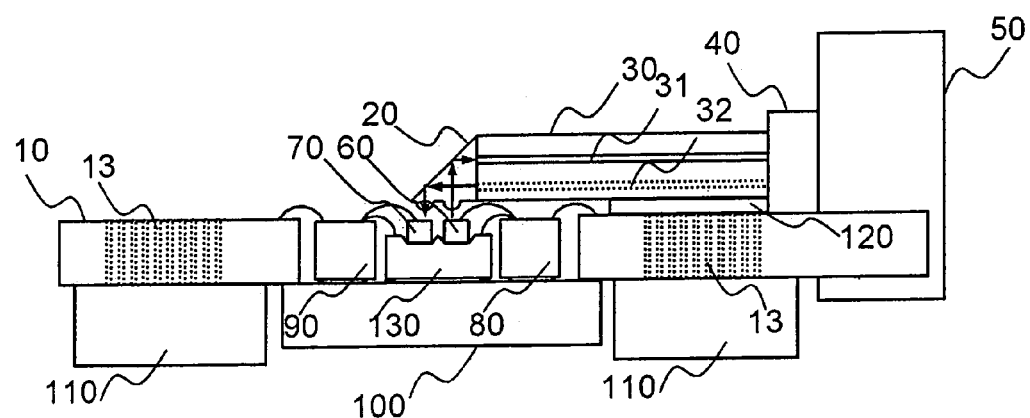

FIGS. 2A and 2B are a plan view and a side view, respectively, showing a 24-channel parallel optical interconnect receiving module (Rx—Rx module) according to an exemplary embodiment of the present invention.

Referring to FIGS. 2A and 2B, the 24-channel parallel optical interconnect receiving module (Rx—Rx module) according to an exemplary embodiment of the present invention includes a substrate 10 having a receiving trench 14, a receiving electrode pad 15, a via hole 13 and a given electric circuit pattern (not shown), and a 2D silicon optical bench 130 having a trench 134 formed on a part thereof. The 24-channel parallel optical interconnect receiving module also includes a photodetector 70 in the trench 134, a receiver 90 for amplifying an electric signal supplied form the photodetector 70 and outputting the electric signal through the electrode pad 15, an adapter 50 connected with an optical connector (not shown) connected to an optical fiber, a 2D optical waveguide 30 having the first and second layers of cores 32 and 31 and a 2D reflector 20 at end portion of the cores, and a 2D ferrule 40 for fixing the 2D optical waveguide 30 to the adapter 50. The substrate 10 and the adapter 50 are coupled to each other in such a manner that an active region (not shown) of the photodetector 70 is opposite to a reflecting surface of the 2D reflector 20. In the 2D silicon optical bench 130, the photodetector 70 is buried in the trench 134 that is formed in consideration of a size of the photodetector 70, so that a precise manual alignment is automatically achieved.

Hereinafter, the 24-channel parallel optical interconnect receiving module (Rx—Rx module) according to the exemplary embodiment of the present invention will be explained in detail with reference to FIGS. 2A and 2B.

Two receivers 90 and two photodetectors 70 are respectively formed on the substrate 10 in an array form. The receiver 90 is bonded on a printed circuit board (PCB) by use of solders, and the photodetector 70 is bonded on a bottom surface of the trench 134 formed in the 2D silicon optical bench 130 by use of the solders. The receiver 90 is connected with the electrode pad 15 by use of a bonding wire, and the photodetector 70 is connected with the receiver 90 by use of the bonding wire. Also, the photodetector 70 may employ a PIN PD as a photodetector element, which receives an optical signal inputted from an exterior through the active region (not shown) and transforms the optical signal into an electric signal. The receiver 90 serves to amplify the electric signal supplied from the photodetector 70 and output the electric signal through the electrode pad 15.

The thicknesses of the cores 31 and 32 of the 2D optical waveguide 30 are constant, but the widths thereof are different from each other so that the widths at a portion where the 2D reflector 20 is coupled are enlarged like a taper shape and the widths at a portion where the 2D ferrule 40 is coupled are the same as the thicknesses of the cores 31 and 32. The longitudinal structure of the cores 31 and 32 of the 2D optical waveguide 30 is provided such that at a portion where the 2D reflector 20 is coupled, the first and second layers of cores 32 and 31 are spaced apart from each other by about 125 μm, but the second layer of core 31 is formed, at its middle portion, as a bend structure so that the first and second layers of cores 32 and 31 are finally not spaced apart from each other at a portion where the 2D ferrule 40 is coupled.

The via hole 13 in the substrate 10 is an electrical path for connecting an external electric signal with the receiver 90, and the heat spreader 100 serves to firstly discharge heat generated from the receiver 90 and the photodetector 70.

An electrode (not shown) of the 2D silicon optical bench is formed on the 2D silicon optical bench 130 so that it is connected with the electrode pad (not shown) of the photodetector 70 and with the neighboring PCB electrode 15 by wire bonding. The photodetector 70 is mounted in the trench 134 of the 2D silicon optical bench 130, which is attached on the heat spreader 100 by use of an adhesive (not shown) with high heat-conductivity. The 2D optical waveguide 30 is arranged and attached on a supporter 120 of the 2D optical waveguide.

(Parallel Optical Interconnect Transceiving Module)

FIGS. 3A and 3B or FIGS. 4A and 4B are a plan view and a side view, respectively, showing a 12-channel parallel optical interconnect transceiving module (Tx-Rx module or Rx-Tx module) according to an exemplary embodiment of the present invention.

Referring to these FIGS. 3 and 4, the 12-channel parallel optical interconnect transceiving module (Tx-Rx module or Rx-Tx module) according to an exemplary embodiment of the present invention includes a substrate 10 having a transceiving trench 16, transceiving electrode pads 12 and 15, a via hole 13 and a given electric circuit pattern (not shown), and a 2D silicon optical bench 130 having a trench 134 formed on a part thereof. The 14-channel parallel optical interconnect transceiving module also includes a light source 60 and a photodetector 70 in the trench 134, a driver 80 and a receiver 90 on the substrate 10, respectively for driving the light source 60 according to an electric signal supplied through the electrode pad 12 and for amplifying the electric signal supplied form the photodetector 70 and outputting the electric signal through the electrode pad 15, an adapter 50 connected with an optical connector (not shown) connected with an optical fiber, a 2D optical waveguide 30 having the first and second layers of cores 32 and 31 and a 2D reflector 20 at end portion of the cores, and a 2D ferrule 40 for fixing the 2D optical waveguide 30 to the adapter 50. The substrate 10 and the adapter 50 are coupled to each other in such a manner that an opening (not shown) of the light source 60 and an active region (not shown) of the photodetector 70 are opposite to a reflecting surface of the 2D reflector 20. In the 2D silicon optical bench 130, the light source 60 and the photodetector 70 are buried in the trench 134 that is formed in consideration of a size of the light source 60 and the photodetector 70, so that a precise manual alignment is automatically achieved.

Hereinafter, the 12-channel parallel optical interconnect transceiving module (Tx-Rx module or Rx-Tx module) according to the exemplary embodiment of the present invention will be explained in detail with reference to FIGS. 3 and 4.

One driver 80 and one light source 60, and one receiver 90 and one photodetector 70 are respectively formed on the substrate 10 in an array form. The driver 80 and the receiver 90 are bonded on a PCB by use of solders, and the light source 60 and the photodetector 70 are bonded on a bottom surface of the trench 134 formed in the 2D silicon optical bench 130 by use of the solders. The driver 80 and the receiver 90 are connected with the transmission electrode pad 12 and the receiving electrode pad 15, respectively, by use of a bonding wire, and the light source 60 and the photodetector 70 are respectively connected with the driver 80 and the receiver 90 by use of the bonding wire.

The thicknesses of the cores 31 and 32 of the 2D optical waveguide 30 are constant, but the widths thereof are different from each other so that the widths at a portion where the 2D reflector 20 is coupled are narrowed at transmission side and widened at receiving side like a taper shape, and the widths at a portion where the 2D ferrule 40 is coupled are the same as the thicknesses of the cores 31 and 32. The longitudinal structure of the cores 31 and 32 of the 2D optical waveguide 30 is provided such that at a portion where the 2D reflector 20 is coupled, the first and second layers of cores 32 and 31 are spaced apart from each other by about 125 μm, but the second layer of core 31 is formed, at its middle portion, as a bend structure so that the first and second layers of cores 32 and 31 are finally not spaced apart from each other at a portion where the 2D ferrule 40 is coupled.

(2D Reflector)

Figure 5A:
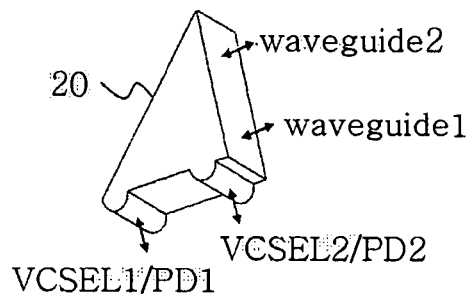
FIGS. 5A to 5D are perspective views showing a structure of a 2D reflector mounted in the parallel optical interconnect module shown in FIGS. 1 to 4, and graphs for explaining an optical design dimension of the 2D reflector.
Figure 5B:
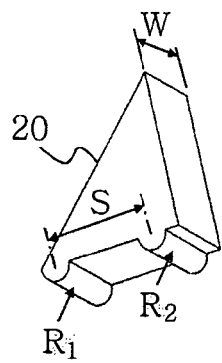

FIGS. 5A and 5B are the views for explaining a structure of the 2D reflector 20. Referring to FIG. 5A, it has a shape of a prism with a cylindrical lens attached thereto. A circular Gaussian optical beam inputted from VCSEL1 or VCSEL2 is regulated with its radiation angle in a horizontal direction by the cylindrical lens, maintaining a substantially parallel angle, and it is spread out in a depth direction in proportion to radiation angle of the VCSEL.

Accordingly, a cross-sectional shape of optical beam at a portion where the 2D optical waveguide 30 is coupled is formed as an oval that is narrow in a vertical direction thereof and is wide in the depth direction thereof. On the contrary, the circular Gaussian optical beam inputted from the 2D optical waveguide 30 is formed with its cross-sectional shape, at a portion coupled to the PD side, as an oval that is narrow to some extent in a horizontal direction thereof and is wide in the depth direction thereof.

FIG. 5B is a view for explaining a design variable where S has the same value as a vertical pitch of the 2D optical waveguide 30 and the 2D ferrule 40, and W has a value of more than 3.3 mm corresponding that horizontal pitch (250 μm ) of the 2D optical waveguide 30 and the 2D ferrule 40 is provided for 12 channels. R1 and R2 have a value that is somewhat small if they all are used for transmitting signal, that is somewhat large if they all are used for receiving signal, and that is different from each other if they are respectively used for transmitting or receiving signal.

Figure 5C:
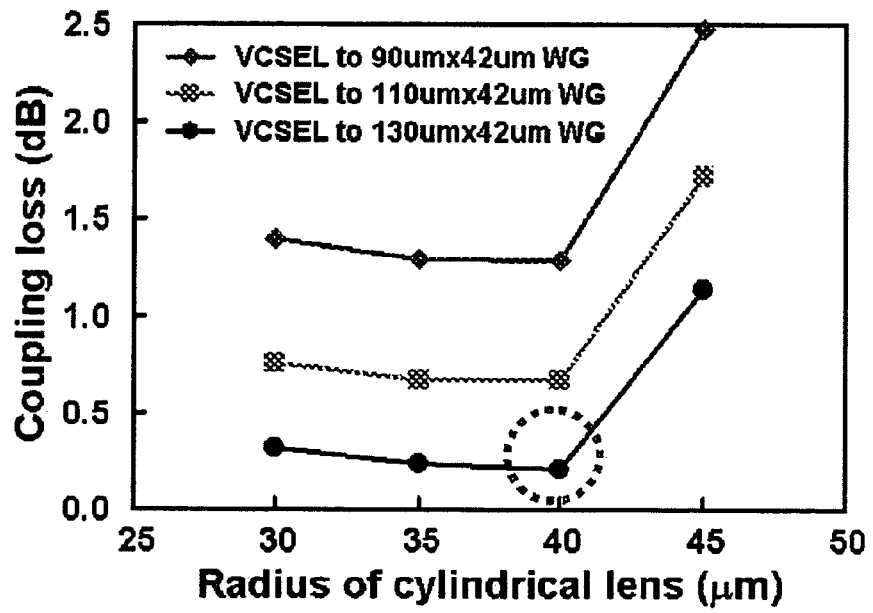
Figure 5D:
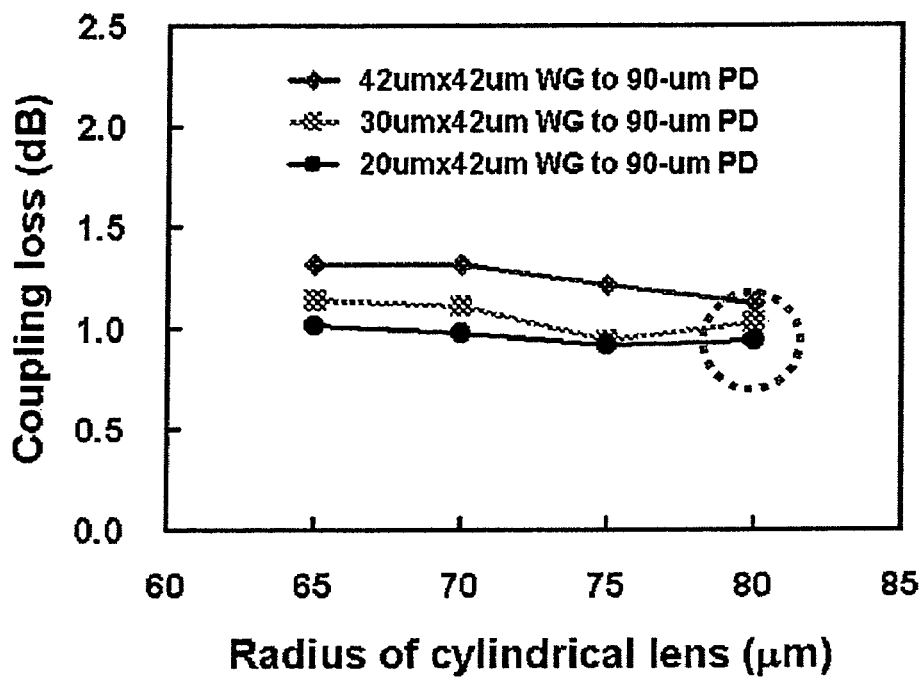

FIGS. 5C and 5D are graphs illustrating a simulation result by a Ray tracing method for a structure of the 2D reflector 20 wherein FIG. 5C is for a case that the 2D reflector is used for transmitting signal, and FIG. 5D is for a case that the 2D reflector is used for receiving signal.

Herein, a radiation angle of VCSEL is 12°, a prism angle is 45°, and a refractive index is 1.49. As shown in FIG. 5C, the 2D reflector 20 for transmission has a coupling loss that is reduced in proportion to a width of the core of the 2D optical waveguide 30. An optimum value of the coupling loss is 0.2 dB at lens radius of 40 µm. As shown in FIG. 5D, the 2D reflector 20 for reception has a coupling loss that is reduced in inverse-proportion to a width of the core of the 2D optical waveguide 30. An optimum value of the coupling loss is 0.9 dB at lens radius of 80 µm.

The 2D reflector 20 can be manufactured by a technology of X-ray lithography, hot embossing, injection molding and so on.

(2D Optical Waveguide)

Figure 6A:
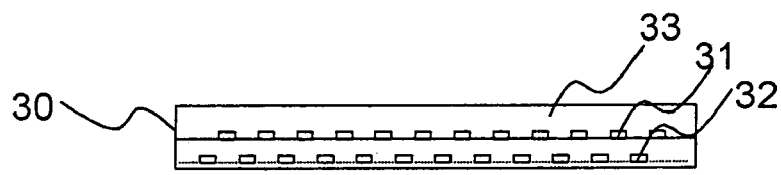
FIGS. 6A to 6D are views showing a structure and a design variable of a 2D optical waveguide mounted in the parallel optical interconnect module shown in FIGS. 1 to 4.
Figure 6B:
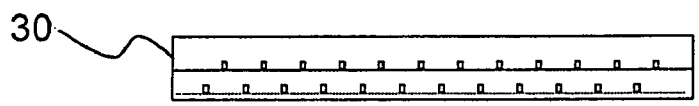
Figure 6C:
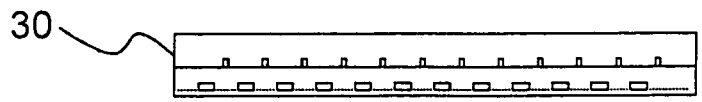
Figure 6D:

Hereinafter, the 2D optical waveguide according to an exemplary embodiment of the present invention will be now described with reference to FIGS. 6A to 6D. FIGS. 6A and 6D are cross-sectional views of a structure of the 2D optical waveguide 30.

The 2D optical waveguide 30 includes a clad layer 33 and two layers of cores 31 and 32. As described before, the cross-sectional surface of the optical waveguide for transmission has a shape of a taper that is narrowed, and that of the optical waveguide for reception has a shape of a taper that is widened.

FIGS. 6A, 6B, 6C and 6D are views of a cross-sectional structure of the cores coupled to the 2D reflector 20, respective views corresponding to the cases of the 24-channel optical interconnect transmission module (see FIG. 1), the 24-channel optical interconnect receiving module (see FIG. 2), the 12-channel optical interconnect transceiving module (see FIG. 3), and the 12-channel optical interconnect transceiving module (see FIG. 4), respectively.

According to one embodiment, SH and SV all are 250 µm, and WCO×WCO is 42 µm×42 µm. Such 2D optical waveguide can be manufactured by a technology of hot embossing processing, UV embossing, injection molding, photolithography and so on.

(2D Ferrule)

Figure 7:
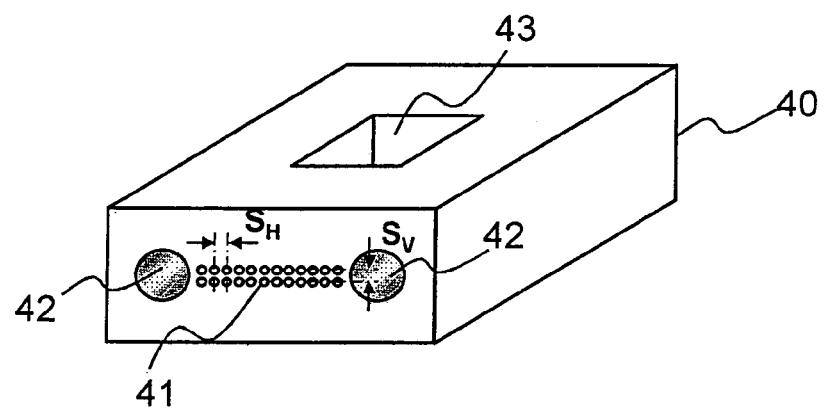
FIG. 7 is a view showing a structure and a design variable of a 2D ferrule mounted in the parallel optical interconnect module shown in FIGS. 1 to 4.

FIG. 7 is a view of a structure of the 2D ferrule 40.

Referring to FIG. 7, the 2D ferrule 40 of the present invention includes a hole 41 for an optical fiber at its middle portion into which the optical fiber (not shown) is inserted, a guide hole 42 at both sides of the optical fiber hole 41 into which a guide pin (not shown) for connection with the adapter 50 is inserted. The guide hole 42 is a hole into which the guide pin for connection with a multi-channel optical connector is inserted and which is formed suitable for an international standard according to International Electrotechnical Commission (IEC).

Also, as shown in FIG. 7, a fixing hole 43 is formed on the optical fiber hole 41 to be connected with the hole 41. The optical fiber and the 2D ferrule are coupled so that the optical fiber is inserted into the hole 41 and an adhesive (epoxy based material) is provided in the fixing hole 43 and is then cured by use of heat or ultraviolet ray, etc.

The 2D ferrule 40 is formed by a transfer molding method using a material suitable to provide stability of temperature and precise molding, such as for example, the mixture of silica and polymer. The outer dimension of the 2D ferrule 40 is formed compatible to an international standard of IEC, and the inner dimension thereof has a size that the optical fiber can be inserted therein. SH and SV all may be formed to a thickness of 250 µm like in 2D optical waveguide 30.

(2D Optical Bench)

Figure 8A:
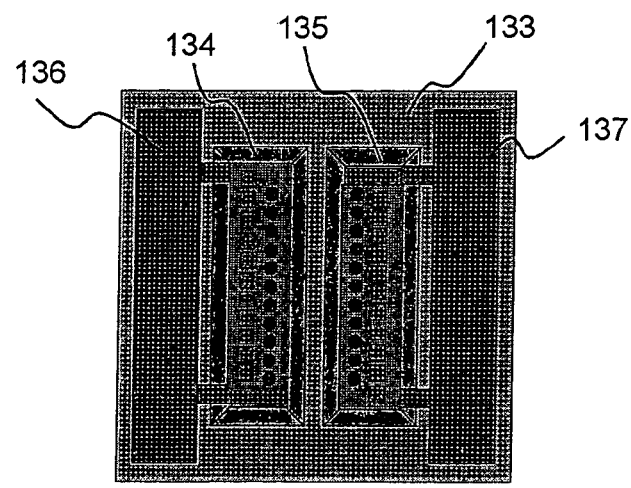
FIGS. 8A and 8B are views showing a structure and a design variable of a 2D silicon optical bench mounted in the parallel optical interconnect module shown in FIGS. 1 to 4.
Figure 8A:
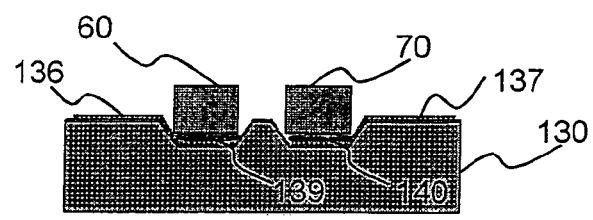
Figure 8B:
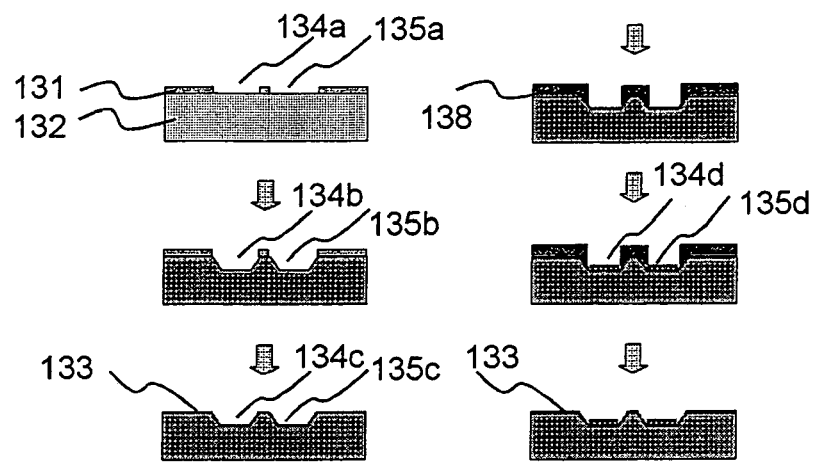

FIGS. 8A and 8B are a plan view and a cross-sectional view of a 2D silicon optical bench 130 for explaining a manual alignment and a bonding type of an array chip of a photodiode (PD) 70 and two rows of VCSEL 60.

In order that the array chip of the VCSEL 60 or the photodiode 70 is horizontally positioned on a desired position after a trench 134d is formed in silicon, the vertical and horizontal widths of etching windows 134a and 135b are regulated with their design dimension before the formation of trench 134, and the trench is then formed to have a depth sufficient to position the array chip of the VCSEL 60 or photodiode 70 in a depth direction desired. Accordingly, the array chip of the VCSEL 60 or photodiode 70 can be manually self-aligned in depth and horizontal directions without a separate alignment process.

FIG. 8B is a cross-sectional view for explaining a process for manufacturing the 2D silicon optical bench shown in FIG. 8A.

Referring to FIG. 8B, a silicon nitride layer 131 is deposited on the silicon 132 using an LPCVD method, and then a photoresist is patterned and the silicon nitride layer is patterned by a reactive ion etching (RIE) process, thereby forming etching windows 134a and 135a. Then, the silicon 132 is wet-etched by KOH to form the trenches 134b and 135b, and the pattern of the silicon nitride layer 131 is removed by use of phosphoric acid or buffered oxide etch (BOE). Then, a silicon nitride layer 133 is deposited by a PECVD method and so on. Ultra-thick film of photoresist such as AZ9260 or AZ4903 and so on is applied thereto, and a photoresist pattern 138 is formed. Then, Ti, Ni and Au are successively deposited by use of an E-beam deposition apparatus, the photoresist pattern is removed, and rapid thermal annealing is conducted thereto.

Then, the array chip of the light source 60 or photodetector 70 is inserted into the trenches 134 and 135 of the silicon optical bench 130 and heat is applied to the 2D silicon optical bench 130 while proper pressure is applied to the array chip so that the array chip is attached to the solder on a bottom of the trenches 134 and 135 of the 2D silicon optical bench 130 while being self-aligned.

Figure 9A:
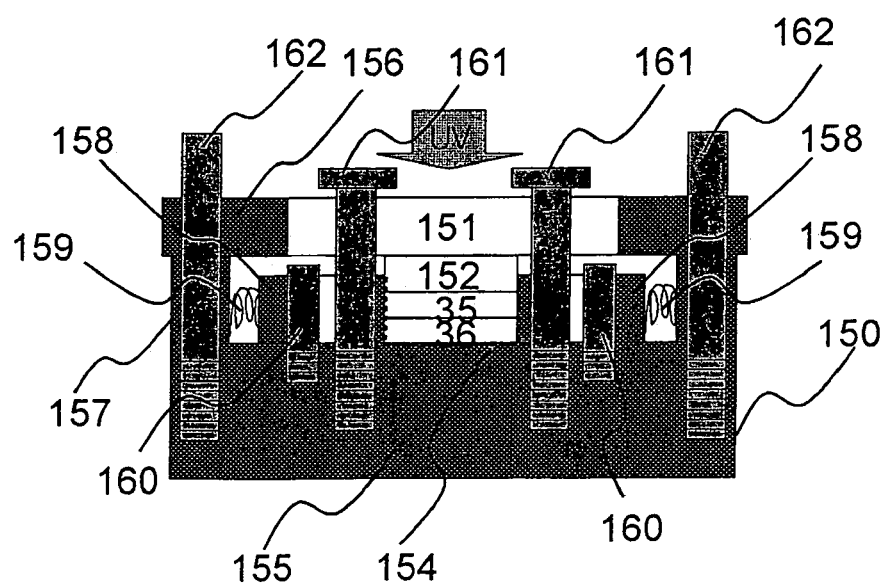
FIGS. 9A to 9C are views showing a structure and a design variable of a jig for laminating a 2D optical waveguide in two layers mounted in the parallel optical interconnect module shown in FIGS. 1 to 4.
Figure 9B:
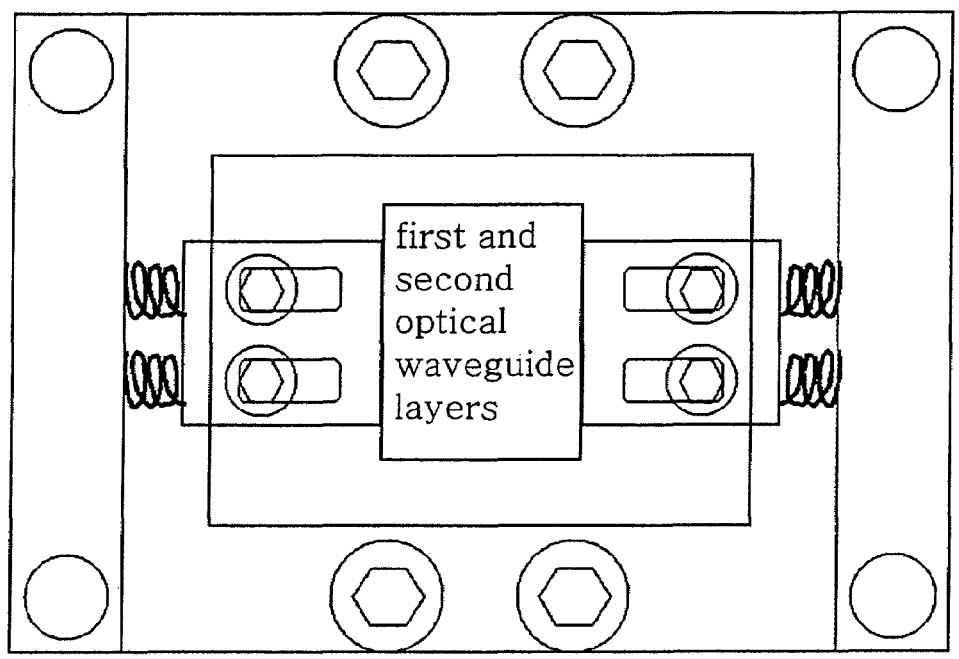
Figure 9C:
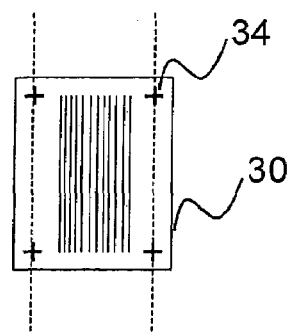

FIGS. 9A to 9C are views showing a structure and a design variable of a jig for laminating a 2D optical waveguide in two layers mounted in the parallel optical interconnect module shown in FIGS. 1 to 4.

First, embossed optical waveguide films 35 and 36 for first and second layers are precisely sawed along a mark 34, and as shown in FIG. 9A, the optical waveguide films 36 and 35 for first layer and second layer are placed on a predetermined position of a laminating jig 150. A core material is then introduced between the two films. Herein, the optical waveguide films are aligned by an alignment block 158 positioned at both sides of the films. The films are fixed with their upper and lower portions in a vertical direction by use of a transparent rubber 152 and a transparent glass 151. At this time, a fixing pin 161 is fastened to prepare UV curing. Other elements required for the laminating jig for 2D optical waveguide 30 include Teflon coating 154 for preventing that core material adheres to the surface of the laminating jig 150, a guide pin 162 for aligning a jig cover 156 and a jig body 155, an alignment block spring 159 for stably fixing the sides of the optical waveguide, and so on.

As can be seen in the foregoing, the present invention provides a high capacity parallel optical interconnect module for transmitting an optical signal in parallel through two ribbon optical fibers, receiving the optical signal in parallel through two ribbon optical fibers, transmitting/receiving the optical signal in parallel through two ribbon optical fibers, and receiving/transmitting the optical signal in parallel through two ribbon optical fibers.

According to the present invention, the 2D reflector in a prism shape with the cylindrical lens attached thereto is formed or attached to an end of the cores forming the 2D optical waveguide so that the optical signal is changed with its path by exact 90° and collected. Accordingly, in the course of transmitting the optical signal, a coupling loss is minimized thus to increase optical power.

Also, the 2D silicon optical bench (SiOB) uses a self-alignment method when the array chip of the VCSEL and photodiode is buried in the trench of the optical bench so as to be automatically self-aligned, so that the coupling between VCSEL/PD and the 2D optical waveguide can be manually aligned to improve productivity.

Further, the 2D optical waveguide is attached to the 2D ferrule which is fixed to the adapter so as to provide easy and precise alignment between 2D optical waveguide and light source/photodetector, and the fixing between the 2D optical waveguide and the adapter, so that tolerance of alignment error between the 2D optical waveguide and light source/photodetector is increased, which makes it possible to provide positive and manual alignment, to increase productivity comparing with existing module, and to provide optical interconnect with reduced cost.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A parallel optical interconnect module comprising:
    a substrate on which an electrode pad and a given electric circuit pattern are formed;
    a printed circuit board having a heat spreader in a trench on the substrate;
    a 2D optical bench provided on the substrate and in which the trench is formed;
    a light source provided in the trench to be constituted in at least two rows, so as to generate an optical signal and output the optical signal to an exterior through an opening;
    a driver provided on the substrate to drive the light source according to an electric signal supplied through the electrode pad;
    a 2D reflector designed in a prism shape and having at least two rows of cylinder type lens attached thereto to change paths of at least two rows of optical signals emitted from the light source;
    a 2D optical waveguide having at least two layers of core arrays formed so as to direct light reflected from the 2D reflector; and
    a 2D ferrule capable of loading at least two layers of optical fibers supporting the 2D optical waveguide so as to transmit the light transferred from the 2D optical waveguide to an optical fiber.

2. A parallel optical interconnect module comprising:
    a substrate on which an electrode pad and a given electric circuit pattern are formed;
    a printed circuit board having a heat spreader formed by the formation of a trench formed on a part of the substrate;
    a 2D optical bench provided on the substrate and in which the trench is formed;
    a photodetector provided in the trench formed in the 2D optical bench to be constituted in at least two rows, so as to detect an optical signal transferred from an exterior through an opening;
    a receiver provided on the substrate so as to amplify an electric signal supplied from the photodetector and to output the electric signal through the electrode pad;
    a 2D reflector designed in a prism shape and having at least two rows of cylinder type lens attached thereto to change paths of at least two rows of optical signal incident from an exterior;
    a 2D optical waveguide having at least two layers of core arrays formed so as to direct light reflected from the 2D reflector; and
    a 2D ferrule capable of loading at least two layers of optical fibers supporting the 2D optical waveguide so as to transmit the light from an optical fiber to the 2D optical waveguide.

3. A parallel optical interconnect module comprising:
    a substrate on which an electrode pad and a given electric circuit pattern are formed;
    a printed circuit board having a heat spreader formed by the formation of a trench formed on a part of the substrate;
    a 2D optical bench provided on the substrate and in which the trench is formed;
    a photodetector and a light source provided in the trench formed in the 2D optical bench to be respectively constituted in at least one row, wherein the light source generates an optical signal and outputs the generated optical signal to an exterior through an opening and the photodetector detects the optical signal transferred from the exterior through the opening;
    a driver and a receiver provided on the substrate, wherein the driver drives the light source according to an electric signal supplied through the electrode pad and the receiver amplifies the electric signal supplied from the photodetector to output the amplified electric signal through the electrode pad;
    a 2D reflector designed in a prism shape and having at least two rows of cylinder type lens attached thereto to change a path of the optical signal outputted from the light source or inputted to the photodetector;
    a 2D optical waveguide having at least two layers of core arrays formed so as to direct the light reflected from the 2D reflector; and
    a 2D ferrule capable of loading at least two layers of optical fibers supporting the 2D optical waveguide so as to transmit the light from the 2D optical waveguide to an optical fiber.

4. The parallel optical interconnect module as claimed in claim 1, wherein the light source is a vertical cavity surface emitting laser (VCSEL).

5. The parallel optical interconnect module as claimed in claim 2, wherein the photodetector is a photo diode.

6. The parallel optical interconnect module as claimed in claim 1, wherein the 2D ferrule attached to the 2D optical waveguide is fixed by an adapter.

7. The parallel optical interconnect module as claimed in claim 1, wherein a clad layer of the 2D optical waveguide is composed of a polymer, and the core of the 2D optical waveguide is composed of epoxy.

8. The parallel optical interconnect module as claimed in claim 7, wherein the core has any one of a uniform shape and a funnel shape whose one end portion narrows or widens relative to the other end portion.

9. The parallel optical interconnect module as claimed in claim 6, wherein the 2D ferrule includes two layers of holes for the optical fiber at its middle portion with which the 2D optical waveguide is coupled, guide holes at both sides of the optical fiber hole into which a guide pin for connection with the adapter is inserted, and a fixing hole provided to an upper portion of the optical fiber hole so as to fix the optical waveguide.

10. The parallel optical interconnect module as claimed in claim 9, wherein epoxy is provided in the fixing hole so as to fix the optical fiber.

11. The parallel optical interconnect module as claimed in claim 1, wherein the 2D optical bench is formed of a silicon material.

12. An optical connection apparatus for a parallel optical interconnect module, comprising:

a 2D reflector designed in a prism shape which has at least two rows of cylinder type lens attached thereto to change paths of optical signals emitting in at least two rows;

a 2D optical waveguide having at least two layers of core arrays formed so as to direct light reflected from the 2D reflector; and a 2D ferrule capable of loading at least two layers of optical fibers supporting the 2D optical waveguide so as to transmit the light from the 2D optical waveguide to an optical fiber.

13. The optical connection apparatus as claimed in claim 12, wherein a clad layer of the 2D optical waveguide is formed of a polymer, and the core of the 2D optical waveguide is formed of epoxy.

14. The connection apparatus as claimed in claim 12, wherein the core has any one of a uniform shape and a funnel shape whose one end portion narrows or widens relative to the other end portion.

* * * * *